(12) United States Patent
Cui et al.

(10) Patent No.: US 11,019,758 B2
(45) Date of Patent: May 25, 2021

(54) ELECTROMAGNETIC SHIELDING FILM AND PREPARATION METHOD THEREFOR

(71) Applicant: HENAN GUOAN ELECTRONIC MATERIAL CO., LTD., Henan (CN)

(72) Inventors: Qingchen Cui, Henan (CN); Guofa Li, Henan (CN); Wenjuan Song, Henan (CN)

(73) Assignee: HENAN GUOAN ELECTRONIC MATERIAL CO., LTD., Henan (CN)

( * ) Notice: Subject to any disclaimer, the term of this patent is extended or adjusted under 35 U.S.C. 154(b) by 0 days.

(21) Appl. No.: 16/340,513

(22) PCT Filed: Jun. 21, 2018

(86) PCT No.: PCT/CN2018/092148
§ 371 (c)(1),
(2) Date: Apr. 9, 2019

(87) PCT Pub. No.: WO2019/052247
PCT Pub. Date: Mar. 21, 2019

(65) Prior Publication Data
US 2019/0246528 A1    Aug. 8, 2019

(30) Foreign Application Priority Data

Sep. 15, 2017 (CN) .......................... 201710830858.4

(51) Int. Cl.
*H05K 9/00* (2006.01)
*B32B 15/092* (2006.01)
*B82Y 30/00* (2011.01)

(52) U.S. Cl.
CPC ......... *H05K 9/0084* (2013.01); *B32B 15/092* (2013.01); *H05K 9/00* (2013.01); *H05K 9/0083* (2013.01); *B32B 2307/212* (2013.01); *B82Y 30/00* (2013.01)

(58) Field of Classification Search
CPC ....................... H05K 9/0088; B32B 2307/212
USPC ....................................................... 252/62.54
See application file for complete search history.

(56) References Cited

U.S. PATENT DOCUMENTS

2013/0299732 A1    11/2013    Kwak et al.

FOREIGN PATENT DOCUMENTS

| CN | 1242137 A | 1/2000 |
| CN | 101772996 A | 7/2010 |
| CN | 103619154 A | 3/2014 |
| CN | 103763893 A | 4/2014 |

(Continued)

OTHER PUBLICATIONS

International Search Report dated Oct. 23, 2018 from corresponding PCT Application No. PCT/CN2018/092150.

(Continued)

*Primary Examiner* — Khanh T Nguyen
(74) *Attorney, Agent, or Firm* — Innovation Capital Law Group, LLP; Vic Lin

(57) ABSTRACT

Disclosed is an electromagnetic shielding film, comprising a release film layer, an insulation layer, a black insulation shielding layer, a metal layer, a conductive paste layer and a protective film layer which are sequentially connected. The conductive paste layer further comprises an electromagnetic wave absorbent. The electromagnetic wave absorbent is a mixture of one or more of carbon nanotubes, graphene and ferrite.

8 Claims, 1 Drawing Sheet

(56) References Cited

FOREIGN PATENT DOCUMENTS

| CN | 104883866 | A |   | 9/2015 |   |
|----|-----------|---|---|--------|---|
| CN | 105950054 | A |   | 9/2016 |   |
| CN | 106061107 | A |   | 10/2016 |   |
| CN | 106604623 | A |   | 4/2017 |   |
| CN | 206067098 | U |   | 4/2017 |   |
| CN | 206350294 | U |   | 7/2017 |   |
| CN | 107072130 | A |   | 8/2017 |   |
| CN | 107148209 | A |   | 9/2017 |   |
| CN | 206650912 | U |   | 11/2017 |   |
| CN | 107592783 | A |   | 1/2018 |   |
| CN | 107801366 | A |   | 3/2018 |   |
| JP | 2009-038278 | A | * | 2/2009 | ............ B32B 15/04 |
| JP | 2009277980 | A |   | 11/2009 |   |
| JP | 5411521 | B2 |   | 2/2014 |   |

OTHER PUBLICATIONS

International Search Report dated Sep. 20, 2018 from PCT Application No. PCT/CN2018/092148.

\* cited by examiner

000000# ELECTROMAGNETIC SHIELDING FILM AND PREPARATION METHOD THEREFOR

FIELD

The present invention belongs to the field of electromagnetic shielding films, and in particular relates to an electromagnetic shielding film and a method for making the same.

BACKGROUND

In recent years, with the development of information and communication equipment, electromagnetic shielding films have become more and more widely used. Electromagnetic shielding film is also called EMI protective film, or absorbing material, which is pressed into a non-adhesive copper clad plate or a cover film to weaken or eliminate electromagnetic interference to the internal circuit, mainly after punching. The material is widely used in the flexible circuit board (FPC) industry. Flexible circuit board is a highly reliable and excellent flexible printed circuit board made of polyimide or polyester film as basic material, which is called soft board or FPC, and has high wiring density, light weight, small thickness and flexible appearance design and other advantages. Thus, in recent years, it has been widely used in circuit boards of electronic communication, photographic equipment, printers, mobile phones, and portable computers.

While the flexible circuit board has many of the above advantages, it also has an important index, that is, electromagnetic shielding. If the electromagnetic shielding is not handled properly, it will cause serious electromagnetic interference problems when it is applied to a mobile communication system and affect the operation of the communication system. As electronic and electrical products tend to be more versatile and miniaturized, the number of portable electronic products has increased rapidly, and electromagnetic pollution in the environment has become increasingly serious, which not only causes various instrument malfunctions and system errors, but also has an adverse effect on the human body. Traditional electromagnetic shielding material is based on metal. Although it has certain electromagnetic shielding effects, it has the disadvantages of high material density, easy corrosion, and poor electromagnetic shielding effect on the X-band. Therefore, the electromagnetic shielding film is demanded to have lightweight, high shielding performance and wide shielding band and others.

As a one-dimensional nanomaterial, carbon nanotubes are light in weight, hexagonal structure connected perfectly, and have good electrical conductivity, mechanical properties and heat transfer properties. If other materials are used as a matrix to make composite materials with carbon nanotubes, the composite materials may exhibit good strength, elasticity, fatigue resistance and isotropy, which greatly improve the performance of the composite materials. The small size effect, surface effect, quantum size effect and macroscopic quantum tunneling effect of carbon nanotubes make it a very potential electromagnetic wave absorbent. Graphene is a monolayer two-dimensional crystal with high strength and excellent electrical and thermal conductivity. It is currently the most ideal two-dimensional nanomaterial. Based on its excellent electrical conductivity, thermal conductivity, mechanical properties and low density, graphene can be used as a carbon-based electromagnetic shielding material. Compared with traditional materials, graphene can break through the original limitations and become an effective new absorbing agent to meet the requirements of being "thin, light, wide and strong" of the absorbing material. Ferrite is a metal oxide having ferromagnetism. In terms of electrical properties, the resistivity of ferrite is much larger than that of metal and alloy magnetic materials, and it also has high dielectric properties. The magnetic properties of ferrite also show high magnetic permeability at high frequencies. Therefore, ferrite has become a non-metallic magnetic material widely used in the field of high frequency and weak electricity. For constant and extremely low frequency magnetic fields, ferrite can also be used as a shield, which is a conventional absorbing material.

At present, the shield of a flexible circuit board must form a shielding film layer on its surface. The existing shielding film has a single structure, and only has an electromagnetic wave reflection effect and does not have an electromagnetic wave absorption function, and the shielding effect is not satisfactory.

SUMMARY

In order to solve the deficiencies of the prior art, it is an object of the present invention to provide an electromagnetic shielding film.

Another object of the present invention is to provide a method for making the above electromagnetic shielding film.

In order to achieve the above objectives, the present invention adopts the following technical solutions:

An electromagnetic shielding film comprises a release film layer 1, an insulating layer 2, a metal layer 4, a conductive paste layer 5 and a protective film layer 6 which are sequentially connected.

Preferably, the release film layer and the protective film layer are a non-silicon release material having a thickness of 20-90 μm.

Preferably, a black insulating shielding layer 3 is disposed between the insulating layer and the metal layer, and has a thickness of 2-7 μm.

Further preferably, the insulating layer and the black insulating shielding layer comprise 5-85% of insulating resin by weight, 2-18% of curing agent by weight, 0.1-12% of accelerator by weight, 5-40% of filler by weight and 8-45% of flame retardant by weight.

Still more preferably, the insulating resin is at least one of bisphenol A epoxy resin, bisphenol F epoxy resin, DCPD type epoxy resin and biphenyl type epoxy resin.

Bisphenol A epoxy resin comprises GelR28E (Hongchang Electronic Materials Co., Ltd., epoxy equivalent: 185 g/eq), GESR901 (Hongchang Electronic Materials Co., Ltd., epoxy equivalent: 475 g/eq), KET4131A70 (Kolon, epoxy equivalent: 215.5 g/eq), jER1256 (Mitsubishi Chemical Co., Ltd., epoxy equivalent: 7800 g/eq), KEB-3165 (Kolon, epoxy equivalent: 220 g/eq); bisphenol F epoxy resin comprises: NC-2000 (Nippon Chemical, epoxy equivalent: 280 g/eq); DCPD type epoxy resin comprises: XD-1000 (Nippon Chemical, epoxy equivalent: 253 g/eq), HP7200 (DIC corporation, epoxy equivalent: 275 g/eq); and biphenyl type epoxy resin comprises NC-3000 (Nippon Chemical, epoxy equivalent: 280 g/eq).

Still more preferably, the curing agent is at least one of a phthalic anhydride type curing agent and a cyanamide type curing agent.

The phthalic anhydride type curing agent comprises phthalic anhydride, pyromellitic dianhydride and hexahydrophthalic anhydride; and the cyanamide curing agent comprises dicyanamide.

Still more preferably, the filler is at least one of aluminum hydroxide, calcium carbonate and carbon black.

Still more preferably, the accelerator is an imidazole accelerator comprising 2-methylimidazole, 1-methylimidazole, 2-ethyl-4-methylimidazole and 1-cyanoethyl-2-ethyl-4-methylimidazole.

Still more preferably, the flame retardant is at least one of a phosphorus-containing flame retardant and a nitrogen-containing flame retardant, comprising OP930 (Klein Chemical Co., Ltd.), PX-200 (DAIHACHI CHEMICAL), PA1 (Solvay) and melamine.

Preferably, the metal layer is a copper plated layer or a silver plated layer and has a thickness of 10 to 5000 nm.

Preferably, the conductive paste layer is epoxy resin to which conductive powder is added; and the conductive powder is a mixture of one or more of silver-coated copper powder, copper powder and nickel powder, and the content is 30-80%.

Further preferably, the epoxy resin comprises at least one of bisphenol A epoxy resin, bisphenol F epoxy resin, DCPD type epoxy resin and biphenyl type epoxy resin. For example, bisphenol A epoxy resin has GelR28E (Hongchang Electronic Materials Co., Ltd., epoxy equivalent: 185 g/eq) of content 3-18%; GESR901 (Hongchang Electronic Materials Co., Ltd., epoxy equivalent: 475 g/eq) of content 5-20%; KET4131A70 (Kolon, epoxy equivalent: 215.5 g/eq) of 2-8%, jER1256 (Mitsubishi Chemical Co., Ltd., epoxy equivalent: 7800 g/eq) of content 3-10%; KEB-3165 (Kolon, epoxy equivalent: 220 g/eq) of content 5-23%; bisphenol F epoxy resin has NC-2000 (Nippon Chemical, epoxy equivalent: 280 g/eq) of content 3-16%; DCPD type epoxy resin has XD-1000 (Nippon Chemical, epoxy equivalent: 253 g/eq) of content 2-9%; HP7200 (DIC corporation, epoxy equivalent: 275 g/eq) of content 3-11%; biphenyl epoxy resin has NC-3000 (Nippon Chemical, epoxy equivalent: 280 g/eq) of the content 2-8%.

Preferably, the conductive paste layer has a thickness of 3-30 μm.

Further preferably, the conductive paste layer further comprises an electromagnetic wave absorbent in an amount of from 0.1 to 5%.

Still more preferably, the electromagnetic wave absorbent is a mixture of one or more of carbon nanotubes, graphene and ferrite.

Preferably, the method for making an electromagnetic shielding film comprises the following steps:

(1) making a release film layer, wherein the raw material comprises a release agent grease, a curing agent and a solvent; the release agent grease comprises a non-silicon release agent such as a modified polyolefin and a fluorine-containing resin; and the curing agent is an anhydride curing agent; and the solvent comprises butanone and ethyl acetate;

(2) making an insulating layer and a black insulating shielding layer by using an insulating resin, a curing agent, a accelerator, a filler and a flame retardant, coating the insulating layer on the release film layer by a coating process, then coating the black insulating shielding layer on the other side of the insulating layer, and then plating metal on the other side of the black insulating shielding layer by the coating process to form a metal layer to obtain a semi-finished product; wherein the insulating layer and the black insulating shielding layer includes 15-55% of insulating epoxy resin by weight, 2-18% of anhydride curing agent by weight, 0.1-12% of imidazole accelerator by weight, 5-40% of aluminum hydroxide filler by weight and 8-45% of phosphorus-containing flame retardant by weight;

(3) making a conductive paste with epoxy resin, conductive powder and an electromagnetic wave absorbent, and coating the conductive paste on the metal layer; and (4) making a shielding film on the other side of the conductive paste by the coating process to obtain a finished product.

Preferably, the coating method of the release film layer, the insulating layer, the black insulating shielding layer and the conductive paste layer comprises a combination of one or more of extrusion coating, blade coating, screen printing, roller printing and micro concave printing.

Preferably, the electromagnetic shielding film is suitable for a flexible circuit board.

The conductive paste layer of the present invention plays the role of grounding and electromagnetic wave absorption, and the metal plated layer plays the role of electromagnetic wave reflection.

Since the electromagnetic wave absorbent is added to the conductive paste in the present invention, the electromagnetic wave shielding film for a flexible circuit board made by the present invention not only has the electromagnetic wave reflection function of the metal layer, but also has the electromagnetic wave absorption function, and improves the electromagnetic shielding effectiveness of the electromagnetic shielding film, while obviously improves the adhesive strength, heat resistance and bending resistance of the conductive paste due to adding a nano-material component to the conductive paste.

ADVANTAGEOUS EFFECTS OF THE INVENTION

1. The manufacturing process of the present invention is easy to implement, and can be realized by a conventional industrial processing process (such as coating, plating, etc.), which is convenient for industrial promotion and application;

2. The electromagnetic wave shielding film for a flexible circuit board made by the present invention not only has the electromagnetic wave reflection function of the metal layer, but also has the electromagnetic wave absorption function of the conductive paste layer, thereby improving the electromagnetic shielding effectiveness of the shielding film; and 3. Since a nano-material component is added to the conductive paste, in addition to the enhancement of the electromagnetic shielding function, the adhesive strength, heat resistance and bending resistance of the conductive paste are obviously improved.

DETAILED DESCRIPTION

Example 1

Figure 1:
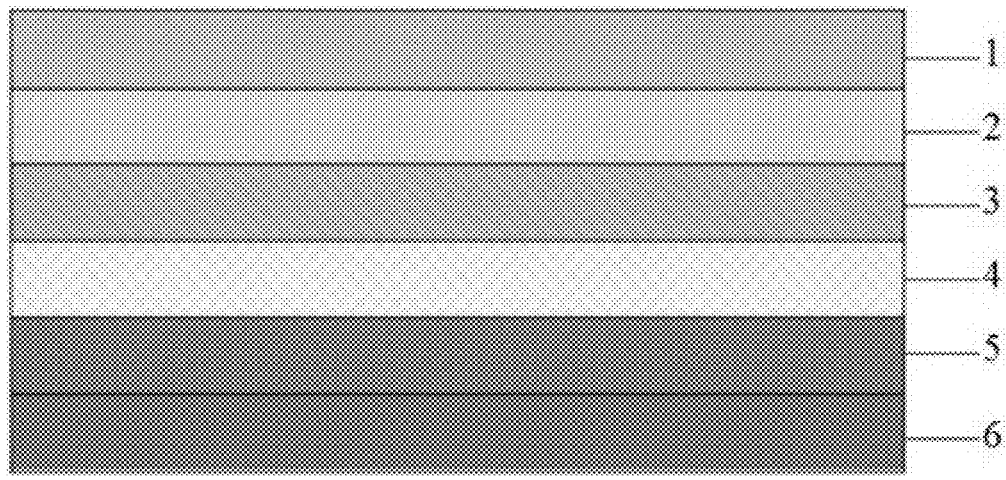
FIG. 1 is a schematic view of the structure of the present invention, wherein 1 represents release film layer, 2 represents insulation layer, 3 represents black insulating shielding layer, 4 represents metal layer, 5 represents conductive paste layer and 6 represents protective film layer.
Figure 2:
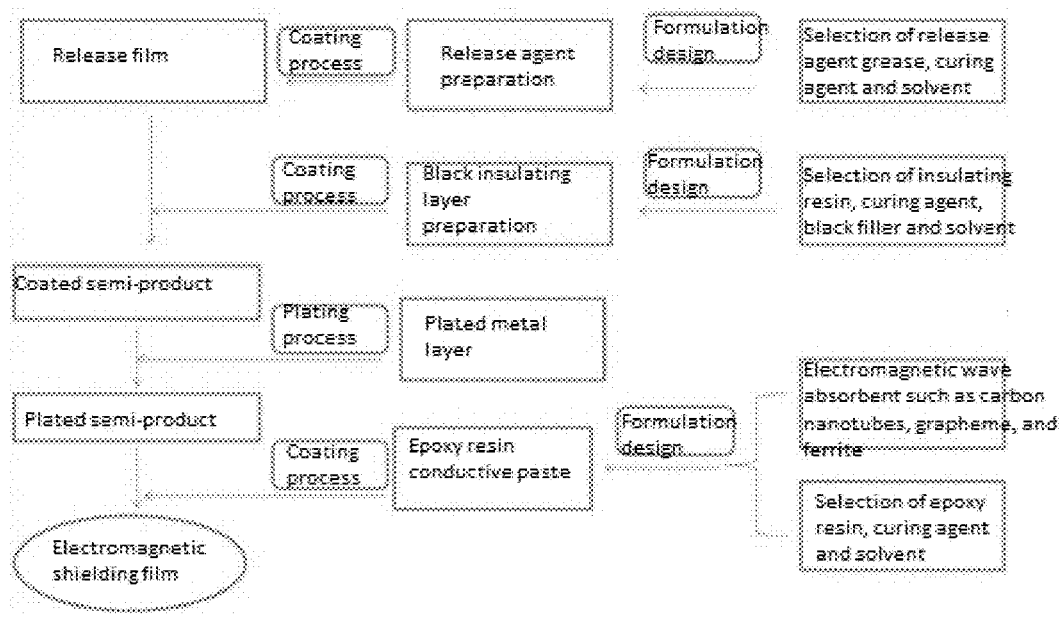
FIG. 2 is a production flow chart of the present invention.

An electromagnetic shielding film, the structure of which is shown in FIG. 1 and the production process is shown in FIG. 2, comprising the following steps:

(1) making a release film layer, wherein the raw material comprises 45% of release agent grease, 5% of curing agent and 50% of solvent;

(2) making an insulating layer and a black insulating layer by using 23% of insulating resin, 4% of curing agent, 0.5% of accelerator, 8% of filler and 7.8% of flame retardant, coating the insulating layer on the release film by a coating process, coating the black insulating layer on the other side of the insulating layer, and then plating a copper layer on the other side of the black insulating layer by a plating process to form a metal layer having a thickness of 100 nm to obtain a semi-finished product;

(3) making a conductive paste with 12% of epoxy resin and 65% of conductive powder, and coating the conductive paste on the metal layer; and (4) making a shielding film on the other side of the conductive paste by the coating process to obtain a finished product and test its properties.

Example 2

An electromagnetic shielding film, the raw materials and production method are as follows:

(1) making a release film layer, wherein the raw material comprises 45% of release agent grease, 5% of curing agent and 50% of solvent;

(2) making an insulating layer and a black insulating layer by using 23% of insulating resin, 4% of curing agent, 0.5% of accelerator, 8% of filler and 7.8% of flame retardant, coating the insulating layer on the release film by a coating process, coating the black insulating layer on the other side of the insulating layer, and then plating a copper layer on the other side of the black insulating layer by a plating process to form a metal layer having a thickness of 200 nm to obtain a semi-finished product;

(3) making a conductive paste with 12% of epoxy resin, 65% of conductive powder and 1% of carbon nanotubes, and coating the conductive paste on the metal layer; and (4) making a shielding film on the other side of the conductive paste by the coating process to obtain a finished product and test its properties.

Example 3

An electromagnetic shielding film, the raw materials and production method are as follows:

(1) making a release film layer, wherein the raw material comprises 40% of release agent grease, 3.8% of curing agent and 56.2% of solvent;

(2) making an insulating layer and a black insulating layer by using 30% of insulating resin, 6% of curing agent, 0.8% of accelerator, 5% of filler and 8% of flame retardant, coating the insulating layer on the release film by a coating process, coating the black insulating layer on the other side of the insulating layer, and then plating a copper layer on the other side of the black insulating layer by a plating process to form a metal layer having a thickness of 150 nm to obtain a semi-finished product;

(3) making a conductive paste with 17% of epoxy resin, 55% of conductive powder and 1% of graphene, and coating the conductive paste on the metal layer; and (4) making a shielding film on the other side of the conductive paste by the coating process to obtain a finished product and test its properties.

Example 4

An electromagnetic shielding film, the raw materials and production method are as follows:

(1) making a release film layer, wherein the raw material comprises 55% of release agent grease, 6% of curing agent and 39% of solvent;

(2) making an insulating layer and a black insulating layer by using 20% of insulating resin, 4% of curing agent, 0.5% of accelerator, 9% of filler, and 11% of flame retardant, coating the insulating layer on the release film by a coating process, coating the black insulating layer on the other side of the insulating layer, and then plating a copper layer on the other side of the black insulating layer by a plating coating process to form a metal layer having a thickness of 180 nm to obtain a semi-finished product;

(3) making a conductive paste with 20% of epoxy resin, 60% of conductive powder and 1% of ferrite, and coating the conductive paste on the metal layer; and (4) making a shielding film on the other side of the conductive paste by the coating process to obtain a finished product and test its properties.

Example 5

An electromagnetic shielding film, the raw materials and production method are as follows:

(1) making a release film layer, wherein the raw material comprises 45% of release agent grease, 5% of curing agent and 50% of solvent;

(2) making an insulating layer and a black insulating layer by using 20% of insulating resin, 4% of curing agent, 0.5% of accelerator, 9% of filler and 11% of flame retardant, coating the insulating layer on the release film layer by a coating process, coating the black insulating layer on the other side of the insulating layer, and then plating copper on the other side of the black insulating layer by a plating process to form a metal layer having a thickness of 200 nm to obtain a semi-finished product;

(3) making a conductive paste with 12% of epoxy resin, 65% of conductive powder and 5% of carbon nanotubes, and coating the conductive paste on the metal layer; and (4) making a shielding film on the other side of the conductive paste by the coating process to obtain a finished product and test its properties.

The above-described embodiments are preferred embodiments of the present invention, and the present invention can be implemented in other ways, and any obvious alternatives are within the scope of the present invention without departing from the inventive concept.

What is claimed is:

1. An electromagnetic shielding film comprising a release film layer (1), an insulating layer (2), a metal layer (4), a conductive paste layer (5) and a protective film layer (6) which are sequentially connected, wherein the electromagnetic shielding film further comprises a black insulating shielding layer (3) disposed between the insulating layer and the metal layer.

2. The electromagnetic shielding film of claim 1, wherein the release film layer and the protective film layer are a non-silicon release material.

3. The electromagnetic shielding film of claim 1, wherein the insulating layer and the black insulating shielding layer comprise 15-85% of insulating resin by weight, 2-18% of curing agent by weight, 0.1-12% of accelerator by weight, 5-40% of filler by weight and 8-45% of flame retardant by weight.

4. The electromagnetic shielding film of claim 3, wherein the insulating resin is at least one of bisphenol A epoxy resin, bisphenol F epoxy resin, DCPD epoxy resin and biphenyl epoxy resin; the curing agent is at least one of a phthalic anhydride type curing agent and a cyanamide type curing agent; the accelerator is an imidazole accelerator; the filler is at least one of aluminum hydroxide, calcium carbonate and carbon black; and the flame retardant is at least one of a phosphorus-containing and a nitrogen-containing flame retardant.

5. The electromagnetic shielding film of claim 1, wherein the metal layer is a copper plated layer or a silver plated layer.

6. The electromagnetic shielding film of claim 1, wherein the conductive paste layer is epoxy resin to which conductive powder is added.

7. The electromagnetic shielding film of claim 6, wherein the conductive paste layer further comprises an electromagnetic wave absorbent.

8. The electromagnetic shielding film of claim 7, wherein the conductive powder is a mixture of one or more of silver-coated copper powder, copper powder and nickel powder; and the electromagnetic wave absorbent is a mixture of one or more of carbon nanotubes, graphene and ferrite.

\* \* \* \* \*